(12) United States Patent
Takakura et al.

(10) Patent No.: US 12,289,830 B2
(45) Date of Patent: Apr. 29, 2025

(54) WIRING CIRCUIT BOARD AND WIRING CIRCUIT BOARD ASSEMBLY

(71) Applicant: NITTO DENKO CORPORATION, Osaka (JP)

(72) Inventors: Hayato Takakura, Osaka (JP); Naoki Shibata, Osaka (JP); Kenya Takimoto, Osaka (JP); Chihiro Watanabe, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 214 days.

(21) Appl. No.: 18/163,071

(22) Filed: Feb. 1, 2023

(65) Prior Publication Data
US 2023/0254971 A1    Aug. 10, 2023

(30) Foreign Application Priority Data
Feb. 4, 2022   (JP) .................................. 2022-016555

(51) Int. Cl.
*H05K 1/05*    (2006.01)
(52) U.S. Cl.
CPC ..... *H05K 1/05* (2013.01); *H05K 2201/09036* (2013.01)
(58) Field of Classification Search
CPC .................. H05K 1/0296; H05K 1/05; H05K 2201/09927
USPC .......................................................... 174/255
See application file for complete search history.

(56) References Cited

U.S. PATENT DOCUMENTS

| 2015/0189742 | A1* | 7/2015 | Tanabe | G11B 5/484 |
| | | | | 174/255 |
| 2017/0273175 | A1* | 9/2017 | Obinata | G06K 19/06028 |
| 2021/0127499 | A1* | 4/2021 | Takano | H05K 1/0281 |
| 2021/0149175 | A1* | 5/2021 | Ritschel | G02B 21/365 |
| 2022/0078903 | A1* | 3/2022 | Hayashi | G06K 19/06037 |

FOREIGN PATENT DOCUMENTS

| JP | 2007-073863 A | 3/2007 |
| JP | 2011-124491 A | 6/2011 |
| JP | 2015-127119 A | 7/2015 |
| JP | 2016-103587 A | 6/2016 |
| JP | 2017-168608 A | 9/2017 |
| JP | 2021-081722 A | 5/2021 |

\* cited by examiner

*Primary Examiner* — Timothy J Thompson
*Assistant Examiner* — Michael F McAllister
(74) *Attorney, Agent, or Firm* — Edwards Neils LLC; Jean C. Edwards, Esq.

(57) ABSTRACT

A wiring circuit board includes a metal supporting layer, an insulating base layer, and a wiring layer. The wiring circuit board further includes a plurality of streak groove portions disposed on one surface of the metal supporting layer in the thickness direction and a plurality of concave portions depressed in the metal supporting layer in the thickness direction. The plurality of concave portions forms a dot pattern. Each of the dots in the dot pattern has one concave surface. The concave surface has an approximately spherical cap shape or an approximately cone shape.

7 Claims, 10 Drawing Sheets

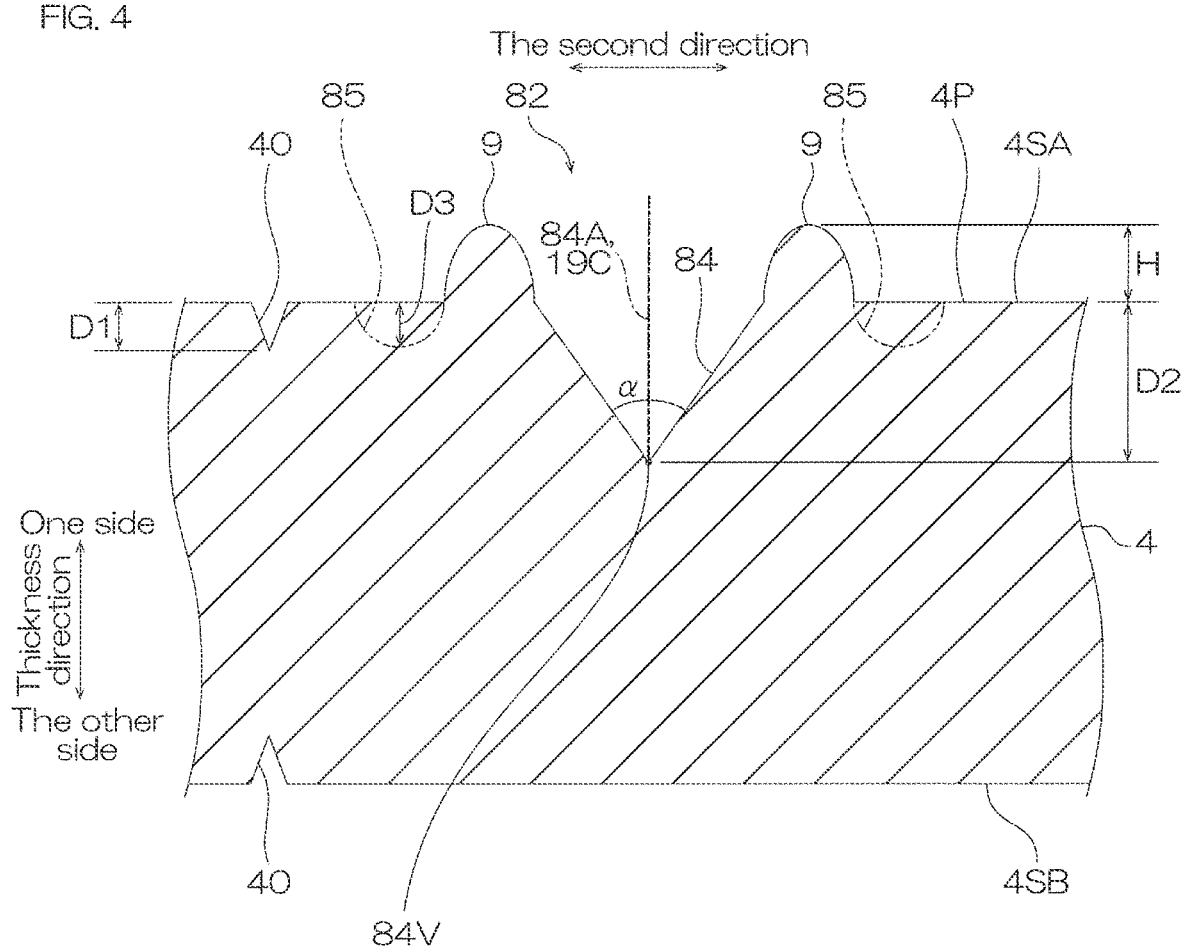

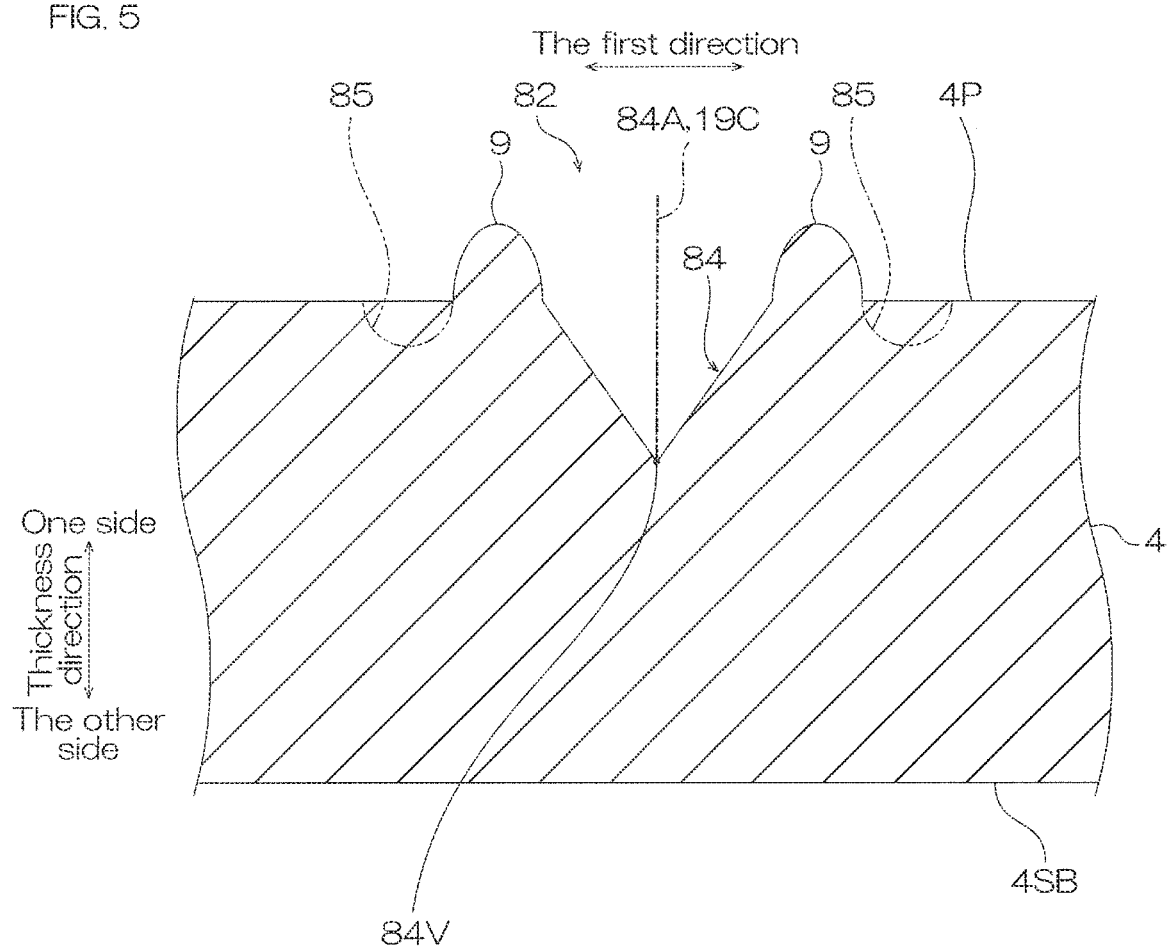

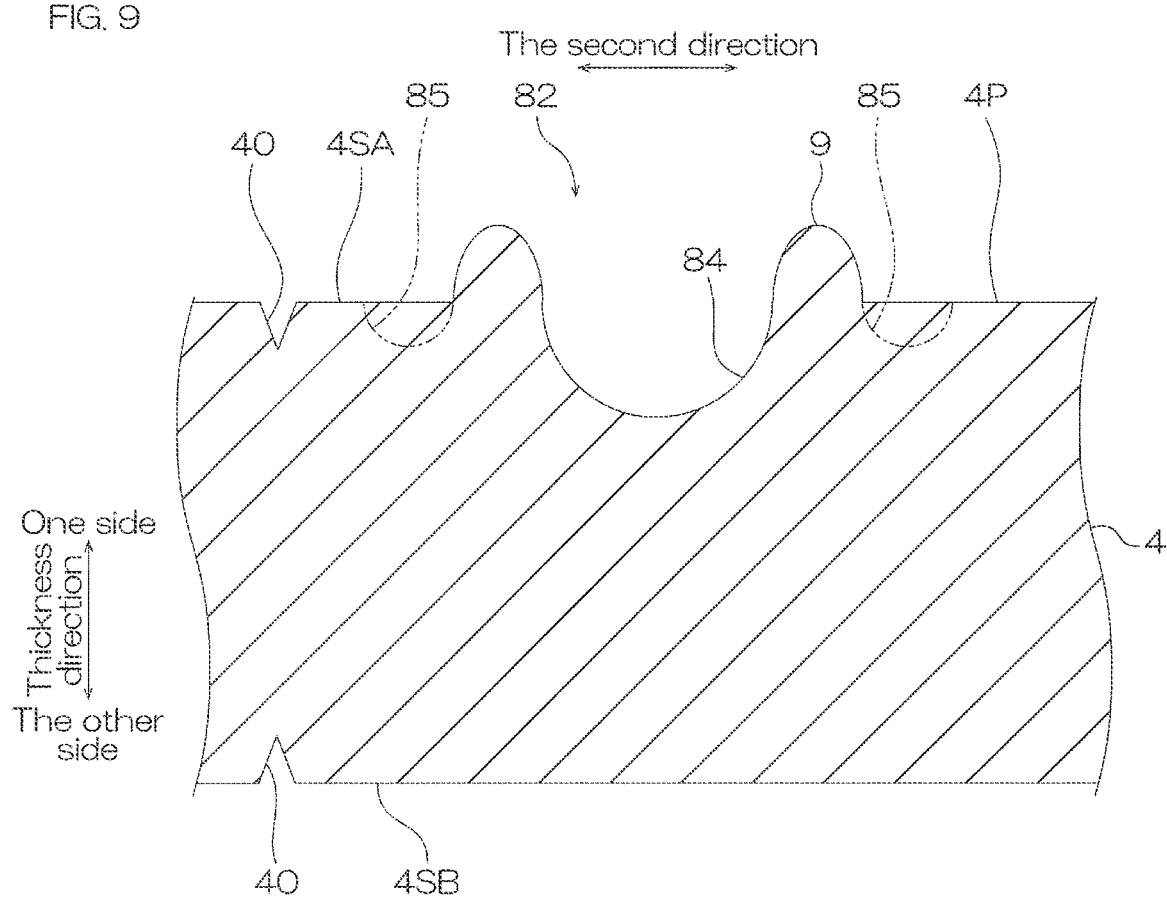

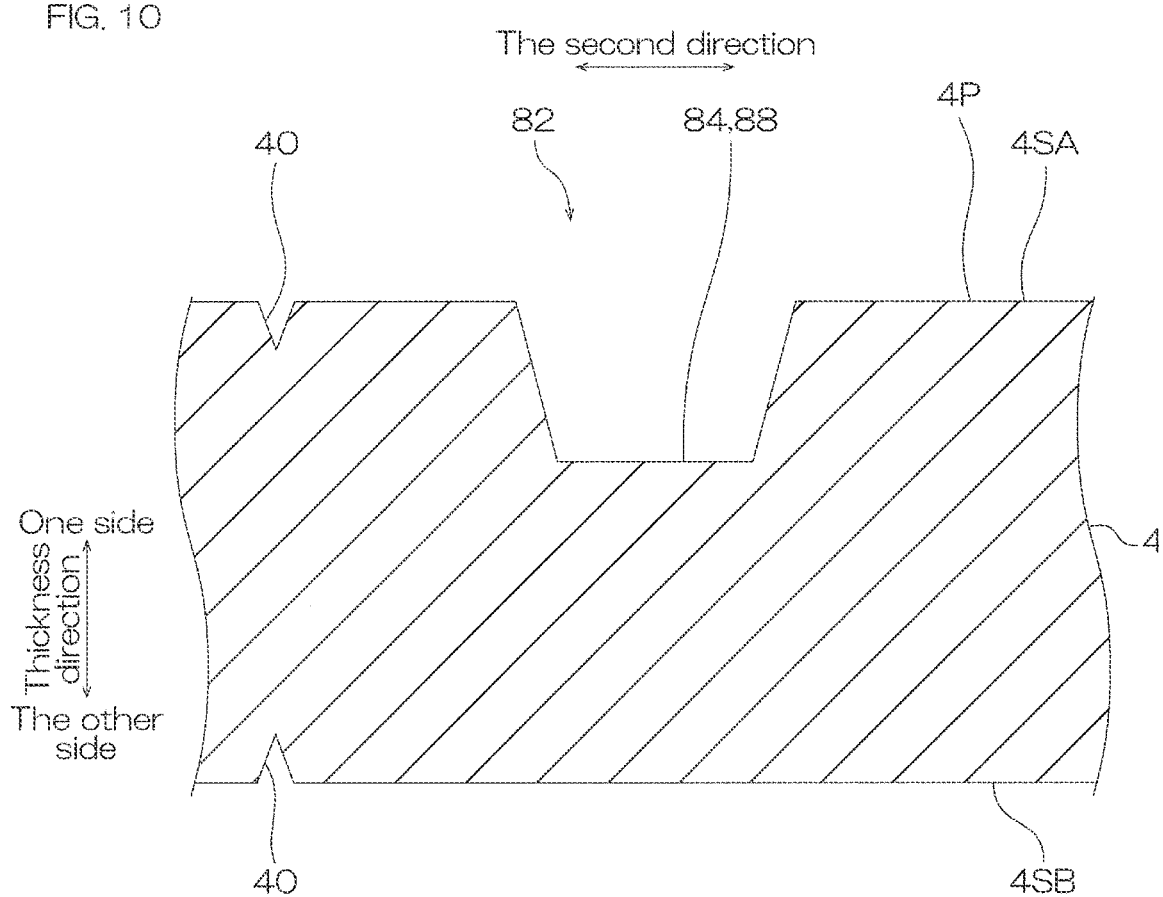

WIRING CIRCUIT BOARD AND WIRING CIRCUIT BOARD ASSEMBLY

CROSS-REFERENCE TO RELATED APPLICATION

The present application claims priority from Japanese Patent Application No. 2022-016555 filed on Feb. 4, 2022, the content of which are hereby incorporated by reference into this application.

BACKGROUND ART

The present invention relates to a wiring circuit board and a wiring circuit board assembly, in particular, to a wiring circuit board and a wiring circuit board assembly including a plurality of the wiring circuit boards.

It has been known to provide a wiring circuit board with a 2-dimensional code to keep track of the wiring circuit board (for example, see Patent document 1 below). The wiring circuit board described in Patent document 1 includes a metal supporting layer, an insulating layer disposed on the upper surface of the metal supporting layer, and a dot pattern (2-dimensional code) provided on the upper surface of the metal supporting layer and spreading two-dimensionally. According to Patent document 1, the dot pattern is formed by etching the upper surface of the metal supporting layer.

CITATION LIST

Patent Document

Patent Document 1: Japanese Unexamined Patent Publication No. 2015-127119

SUMMARY OF THE INVENTION

Problem to be Solved by the Invention

A streak groove may be formed on the upper surface of the metal supporting layer during the production of the metal supporting layer. The production includes the rolling of the metal sheet. When a dot pattern is formed on the upper surface of the metal supporting layer, a streak groove may exist among the dots. This may cause the recognition error of the dot pattern.

The present invention provides a wiring circuit board and a wiring circuit board assembly, both of which can suppress the recognition error of the dot pattern.

Means for Solving the Problem

The present invention [1] includes a wiring circuit board comprising: a metal supporting layer; an insulating layer disposed on one surface of the metal supporting layer in a thickness direction; and a wiring layer disposed on one surface of the insulating layer in the thickness direction, wherein the wiring circuit further comprises a plurality of streak groove portions disposed on the one surface and/or the other surface of the metal supporting layer in the thickness direction, and a plurality of concave portions disposed on the one surface and/or the other surface of the metal supporting layer in the thickness direction and depressed in the metal supporting layer in the thickness direction, the plurality of concave portions forms a dot pattern, each of a plurality of dots of the dot pattern has one concave surface, and the concave surface has an approximately spherical cap shape or an approximately cone shape.

In the wiring circuit board, each of the dots of the dot pattern has one concave surface, and the concave surface has an approximately spherical cap shape or an approximately cone shape. Accordingly, the concave surface is more recognizable than the streak groove portion. Thus, even if the wiring circuit board includes a streak groove portion, the recognition error of the dot pattern can be suppressed.

The present invention [2] includes the wiring circuit board in the above [1], wherein each of the dots is located at an outer peripheral end portion of each of the concave portions and has a raised surface that is raised in the thickness direction.

The wiring circuit board further includes the raised surface located at the outer peripheral end portion of each of the concave portions, and thus the concave portions are more easily recognized.

The present invention [3] includes the wiring circuit board described in the above [1] or [2], wherein a depth D2 of the concave portion is a depth D1 of the streak groove portion or more.

The depth D2 of the concave portion is the depth D1 of the streak groove portion or more, and thus the concave portion is more easily recognized.

The present invention [4] includes the wiring circuit board described in described in any one of the above [1] to [3], wherein the concave portion has a diameter of 50 μm or less when the concave portion is viewed in the thickness direction.

The diameter of the concave portion is 50 μm or less, and thus the concave portion formation region can be made compact and the amount of information of the dot pattern can be increased.

The present invention [5] includes the wiring circuit board described in described in any one of the above [1] to [4], wherein the dot pattern is a 2-dimensional code.

The present invention [6] includes the wiring circuit board described in described in any one of the above [1] to [5], wherein the concave portions are laser marks.

In the wiring circuit board, each of the concave portions is a laser mark and thus can suppress the recognition error as compared with a concave portion formed by etching.

The present invention [7] includes a wiring circuit board assembly comprising: a metal frame; and a plurality of the wiring circuit boards according to claim 1 being disposed inside the metal frame, wherein the metal frame and the metal supporting layer are included in a common metal supporting board, and a plurality of streak groove portions are formed on the metal supporting board.

The wiring circuit board assembly includes the above-described wiring circuit boards and thus can suppress the recognition error of the dot pattern.

Effects of the Invention

The wiring circuit board and wiring circuit board assembly of the present invention can suppress the recognition error of the dot pattern.

BRIEF DESCRIPTION OF THE DRAWINGS

FIG. 4 is a cross-sectional view taken along line X-X of FIG. 3.

FIG. 5 is a cross-sectional view taken along line Y-Y of FIG. 3.

FIG. 6A illustrates a step of preparing a metal supporting board. FIG. 6B illustrates a step of forming an insulating base layer, a wiring layer, and an insulating cover layer. FIG. 6C illustrates a step of processing the outer shape of the metal supporting board. FIG. 6D illustrates a step of forming a plurality of concave portions.

FIG. 7A and FIG. 7B illustrate a mode in which a pulsed laser is applied several times along a circumferential direction. FIG. 7A illustrate the movements of the laser pulses. FIG. 7B illustrates each mode of the pulsed laser irradiation. FIG. 7C illustrates a mode in which the movement direction in which the laser pulse moves in an inner part is opposite to the movement direction in which the laser pulse moves in an outer part.

FIG. 8A illustrates the pulse of the first irradiation. FIG. 8B illustrates the pulse of the second irradiation. FIG. 8C illustrates the pulse of the third irradiation.

FIG. 9 is a cross-sectional view of a concave portion of a variation.

FIG. 10 is a cross-sectional view of a concave portion of Conventional Example.

DESCRIPTION OF THE EMBODIMENT

With reference to FIGS. 1 to 8C, one embodiment of the wiring circuit board and wiring circuit board assembly of the present invention is described.

1. Wiring Circuit Board Assembly 1

Figure 1:
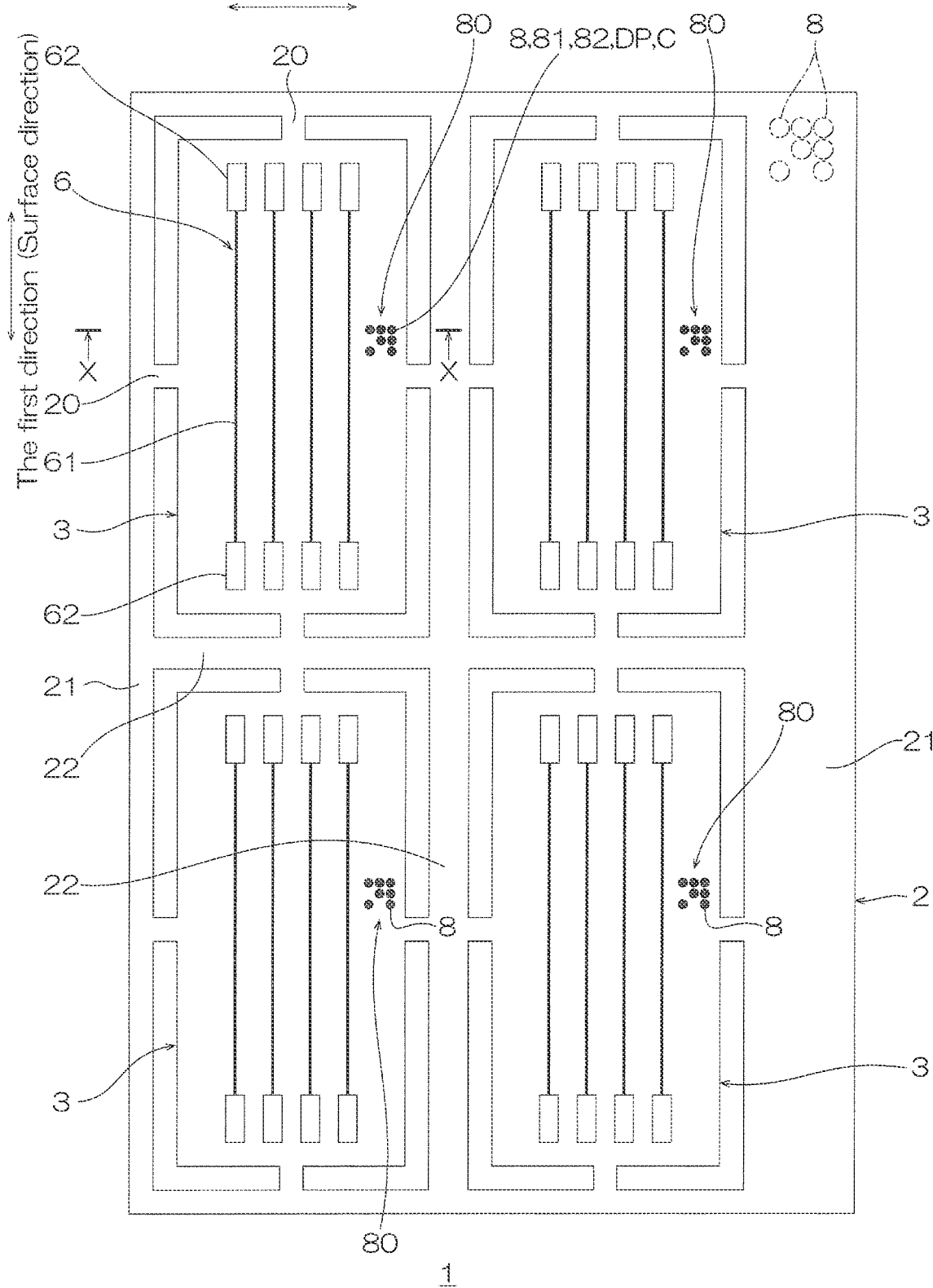
FIG. 1 is a plan view of one embodiment of the wiring circuit board assembly of the present invention.
Figure 2:
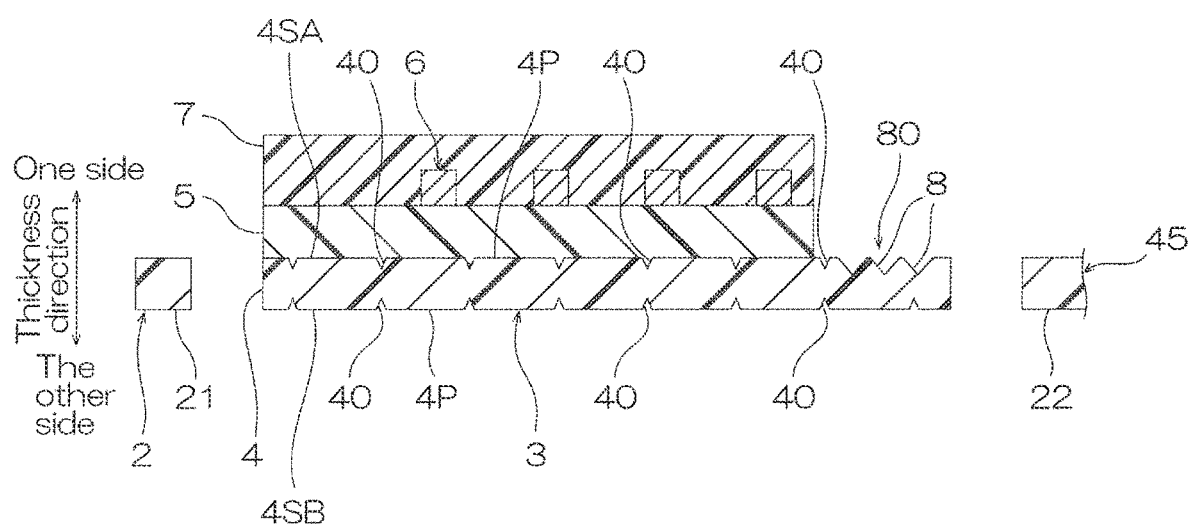
FIG. 2 is a cross-sectional view taken along line X-X of FIG. 1.

As illustrated in FIGS. 1 and 2, a wiring circuit board assembly 1 has a thickness. The wiring circuit board assembly 1 extends in a surface direction. The surface direction is orthogonal to a thickness direction. The wiring circuit board assembly 1 has a board shape. In the present embodiment, the wiring circuit board assembly 1 has, for example, an approximately rectangular shape when being viewed from one side in the thickness direction. The wiring circuit board assembly 1 includes a metal frame 2 and a plurality of wiring circuit boards 3.

1.1 Metal Frame 2

The metal frame 2 extends in the surface direction. The metal frame 2 includes an outside frame 21 and an inside frame 22. When being viewed from one side in the thickness direction, the outside frame 21 has a rectangular frame shape. When being viewed from one side in the thickness direction, the inside frame 22 has a staggered shape. The inside frame 22 is continuous to an inner surface of the outside frame 21.

The metal frame 2 has the same structure as that of a metal supporting layer 4 excluding a concave portion 8 described below. Specifically, the metal frame 2 has one surface 4SA and the other surface 4SB in the thickness direction. Each of the one surface 4SA and the other surface 4SB includes a flat portion 4P. As the material of the metal frame 2, for example, a metal is used. Examples of the metal include copper, copper alloys, and stainless steel alloys. The metal frame 2 has a thickness of, for example, 10 μm or more, preferably 15 μm or more. The thickness of the metal frame 2 is, for example, 500 μm or less, preferably 250 μm or less. In the present embodiment, a plurality of streak groove portions 40 is formed on each of the one surface 4SA and the other surface 4SB of the metal frame 2. The streak groove portions 40 are linear grooves. The streak groove portions 40 are inevitably formed during the production of a metal supporting board 45 (described below). For example, the metal frame 2 is formed into a board shape by rolling of the metal sheet. In such a case, the streak groove portions 40 are formed as grooves due to the rolling of the metal sheet on each of the one surface 4SA and the other surface 4SB of the metal frame 2 in the thickness direction during the rolling of the metal sheet.

1.2 Wiring Circuit Board 3

The plurality of wiring circuit boards 3 is disposed inside the metal frame 2. The wiring circuit boards 3 are separated from each other by an interval. In the present embodiment, the wiring circuit boards 3 are aligned in a first direction and a second direction. The first direction is included in the surface direction. The second direction is included in the surface direction and orthogonal to the first direction. The wiring circuit boards 3 are each connected to (supported by) the metal frame 2 through a joint 20.

The wiring circuit board 3 extends in the surface direction. In the present embodiment, the wiring circuit board 3 has, for example, a rectangular shape when being viewed from one side in the thickness direction. The wiring circuit board 3 has flexibility. The wiring circuit board 3 includes the metal supporting layer 4, an insulating base layer 5 as an example of an insulating layer, a wiring layer 6, and an insulating cover layer 7.

1.2.1 Metal Supporting Layer 4

The metal supporting layer 4 is disposed at the other end portion of each of the wiring circuit boards 3 in the thickness direction. The metal supporting layer 4 has a thickness. The metal supporting layer 4 has the one surface 4SA and the other surface 4SB in the thickness direction. The other surface 4SB forms the other surface of each wiring circuit board 3 in the thickness direction. Each of the one surface 4SA and the other surface 4SB includes the flat portion 4P. The metal supporting layer 4 forms the outer shape of the wiring circuit board 3 when being viewed from one side in the thickness direction. The material and thickness of the metal supporting layer 4 are the same as the above-described ones of the metal frame 2.

1.2.2 Scratch Groove Portion 40

In the present embodiment, a plurality of streak groove portions 40 is formed on each of the one surface 4SA and the other surface 4SB of the metal supporting layer 4. In other words, the wiring circuit board 3 has the plurality of streak groove portions 40.

The streak groove portions 40 are linear grooves. The streak groove portions 40 are inevitably formed during the formation of the metal supporting board 45 (described below). For example, the metal supporting layer 4 is formed into a board shape by rolling the metal sheet. In such a case, during the rolling of the metal sheet, the streak groove portions 40 are formed as grooves due to the rolling on each of the one surface and the other surface of the metal supporting layer 4 in the thickness direction.

Figure 3:
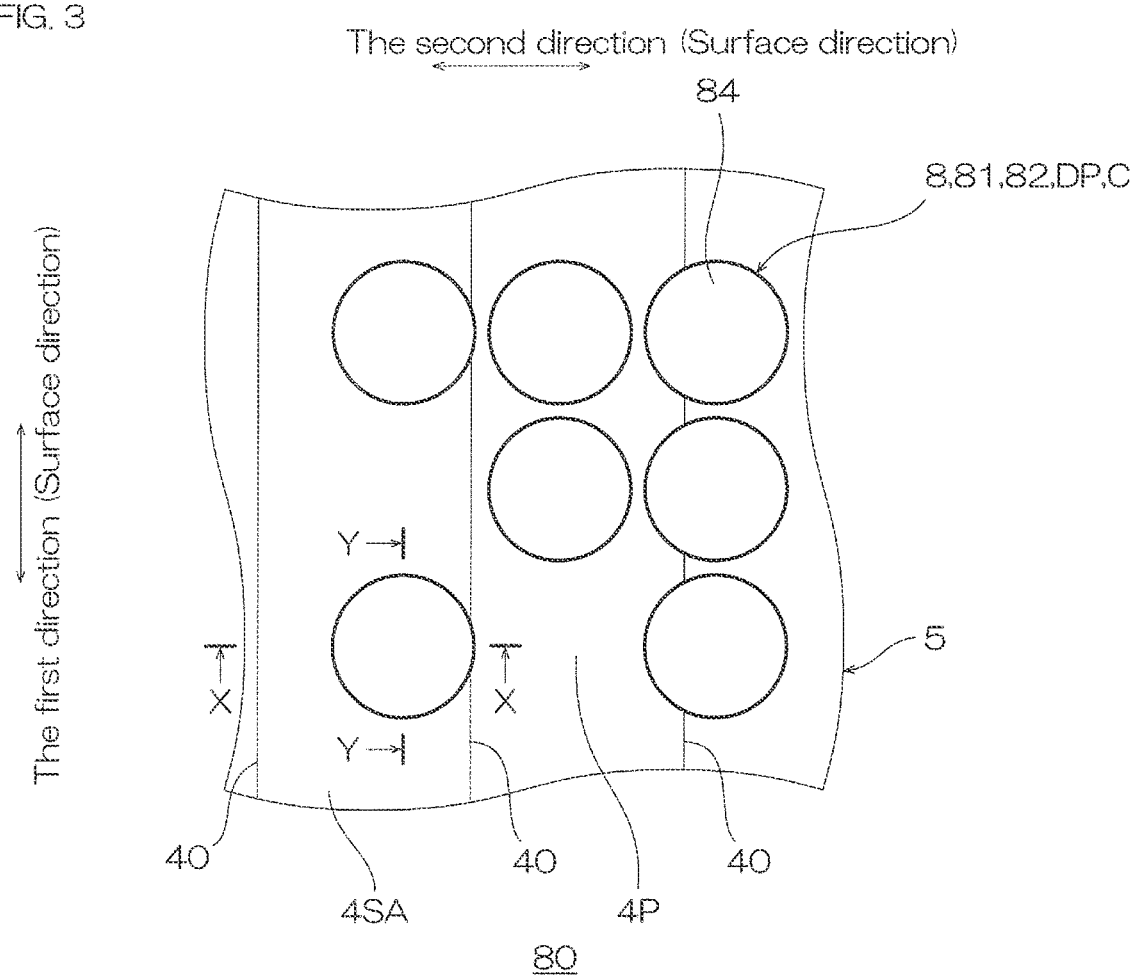
FIG. 3 is a plan view of a concave portion formation region in the wiring circuit board assembly of FIG. 1.

As illustrated in FIG. 3, in the present embodiment, each of the streak groove portions 40 extends along the first direction. The streak groove portions 40 are separate from each other by an interval in the second direction.

As illustrated in FIG. 4, each of the streak groove portions 40 has a depth D1 of, for example, 0.1 μm or more, further 1 μm or more, 1.5 μm or more, 2 μm or more, 2.5 μm or more. The depth D1 of the streak groove portion 40 is, for example, 30 μm or less, further 10 μm or less, 8 μm or less, 6 μm or less, 5 μm or less.

1.2.3 Insulating Base Layer 5

As illustrated in FIG. 2, the insulating base layer 5 is disposed on the one surface 4SA of the metal supporting layer 4 in the thickness direction. The insulating base layer 5 has a pattern shape. The pattern shape is a shape excluding the concave portion formation region 80 described below. The insulating base layer 5 has flexibility. Examples of the material of the insulating base layer 5 include insulating resins. Examples of the insulating resin include polyimide. The insulating base layer 5 has a thickness of, for example, 1 μm or more, preferably 3 μm or more. The thickness of the insulating base layer 5 is, for example, 35 μm or less

1.2.4 Wiring Layer 6

The wiring layer 6 is disposed on one surface of the insulating base layer 5 in the thickness direction. As illustrated in FIG. 1, the wiring layer 6 includes a plurality of wires 61 and a plurality of terminals 62. In the present embodiment, each of the wires 61 extends in the first direction. The wires 61 are separated from each other by an interval in the second direction. Two terminals 62 are connected to both end portions of a wire 61 in the first direction, respectively. Examples of the material of the wiring layer 6 include conductors. Examples of the conductors include copper, copper alloys, and stainless steels. The wiring layer 6 has a thickness of, for example, 1 μm or more, preferably 3 μm or more. The thickness of the wiring layer 6 is, for example, 50 μm or less, preferably 30 μm or less.

1.2.5 Insulating Cover Layer 7

As illustrated in FIG. 2, the insulating cover layer 7 is disposed on the one surface of the insulating base layer 5 in the thickness direction. The insulating cover layer 7 covers the wires 61 and exposes the terminals 62. The insulating cover layer 7 has flexibility. Examples of the material of the insulating cover layer 7 include the above-described insulating resins. The insulating cover layer 7 has a thickness of, for example, 2 μm or more, preferably 4 μm or more. The thickness of the insulating cover layer 7 is, for example, 60 μm or less, preferably 40 μm or less.

1.2.6 A Plurality of Concave Portions 8

The wiring circuit board 3 further includes a concave portion formation region 80. The concave portion formation region 80 is provided on the metal supporting layer 4 in the wiring circuit board 3. In the present embodiment, the concave portion formation region 80 is defined on the one surface 4SA of the metal supporting layer 4 in the thickness direction. In the concave portion formation region 80, the above-described insulating base layer 5, wiring layer 6, and insulating cover layer 7 are not disposed. In other words, in the concave portion formation region 80, the one surface 4SA of the metal supporting layer 4 is exposed toward one side in the thickness direction. However, the above-described streak groove portions 40 are formed also in the concave portion formation region 80. In the concave portion formation region 80, a plurality of concave portions 8 is provided. In other words, the wiring circuit board 3 further includes the plurality of concave portions 8.

1.2.7 Concave Portion 8

Each of the concave portions 8 is depressed on the one surface 4SA of the metal supporting layer 4 toward the other side in the thickness direction. As illustrated in FIG. 3, the concave portions 8 are separated from each other by an interval in the surface direction (the first direction and the second direction). The plurality of concave portions 8 forms a dot pattern DP.

The dot pattern DP is a pattern made by randomly disposing an arbitrary number of dots 82 in the above-described concave portion formation region 80. The dot pattern DP forms a 2-dimensional code C. In other words, the plurality of concave portions 8 forms the 2-dimensional code C by forming the dot pattern DP in the concave portion formation region 80.

The 2-dimensional code C is, for example, a code that can record the information about the wiring circuit board 3 and/or wiring circuit board assembly 1 as digital data. Examples of the information include a manufacturing number, a production lot, the detailed information about the product, and the information about the manufacture. The information recorded in the 2-dimensional code C can be read, for example, based on the number and arrangement of the dots 82 by a recognition device described below. Examples of the 2-dimensional code C include QR codes (registered trademark), CP codes, 2/4 modulation codes, 3/16 modulation codes, 5/9 modulation codes, and data matrices.

As illustrated in FIG. 4 and FIG. 5, each of the dots 82 has one concave surface 84. Further, each of the dots 82 also has one raised surface 9.

1.2.7.1 Concave Surface 84

In the present embodiment, the concave surface 84 has a conical shape. The cone is pointed toward the other side in the thickness direction. In detail, the cone has a vertex 84V at the other end portion in the thickness direction. Specifically, the concave surface 84 is made of the conical surface (generatrix) of the cone. The axis (rotation axis) 84A of the cone goes along the thickness direction. The concave surface 84 has an opening area in a cross-sectional surface taken along the surface direction, and the opening area increases toward one side in the thickness direction. In the present embodiment, the vertex 84V of the cone is the deepest part of the concave portion 8.

1.2.7.2 Raised Surface 9

The raised surface 9 is located at the outer peripheral end portion of each of the concave portions 8. The raised surface 9 is continuous to an outer peripheral edge of the concave surface 84. The raised surface 9 is raised toward one side in the thickness direction. Specifically, the raised surface 9 is raised from the flat portion 4P toward one side in the thickness direction in the concave portion formation region 80.

The raised surface 9 has an approximately ringed shape when being viewed from one side in the thickness direction. The center 19C of the ring does not overlap the raised surface 9 when being viewed from one side in the thickness direction. In the present embodiment, the center 9C overlaps (coincides with) the axis 84A of the concave surface 84.

1.2.7.3 Size of Concave Portion 8

Each of the concave portions 8 has a depth D2 that is, for example, greater than or equal to the depth D1 of the streak groove portion 40. In this manner, the recognition error of the dot pattern DP can more be suppressed. Specifically, the depth D2 of a concave portion 8 is 0.1 μm or more, preferably 0.3 μm or more, more preferably 0.5 μm or more, even more preferably 1.0 μm or more, particularly preferably 1.5 μm or more. The depth of the concave portion 8 is, for example, 100 μm or less, preferably 50 μm or less, more preferably 30 μm or less, even more preferably 15 μm or less, particularly preferably 10 μm or less. To the depth D2 of the concave portion 8, the ratio (D1/D2) of the depth D1 of the streak groove portion 40 is, for example, 0.001 or more, preferably 0.01 or more, more preferably 0.1 or more, and, for example, 0.5 or less. The depth D2 of the concave portion 8 is the distance in the thickness direction from the flat portion 4P to the deepest part of the concave portion 8 (the vertex 84V of the cone) in the concave portion formation region 80.

In a cross-sectional surface of the concave portion 8 taken along the thickness direction, an angle α between two concave surfaces 84 is, for example, 45 degrees or more, preferably 60 degrees or more, and, for example, 150 degrees or less, preferably 120 degrees or less.

The raised surface 9 has a raised height H of, for example, 0.1 μm or more, preferably 0.5 μm or more, and, for example, 5.0 μm or less, preferably 3.0 μm or less. The raised height H of the raised surface 9 is a distance in the thickness direction from the flat portion 4P to the highest part of the raised surface 9 in the concave portion formation region 80. The ratio (H/D2) of the raised height H of the raised surface 9 to the depth D2 of the concave portion 8 is, for example, 0.05 or more, preferably 0.1 or more, and, for example, 0.5 or less, preferably 0.3 or less.

When being viewed from one side in the thickness direction, each of the concave portions 8 has a diameter of, for example, 100 μm or less, preferably 50 μm or less, and, for example, 5 μm or more, preferably 10 μm or more. Where the diameter of each concave portion 8 is the above-described upper limit or less, the concave portion formation region 80 can be compact while the amount of information in the 2-dimensional code C can be increased. Where the diameter of each concave portion 8 is the above-described lower limit or more, the recognition error of the dot pattern DP can be suppressed.

1.8 Production Method

As illustrated in FIGS. 6A to 6D, a method of producing the wiring circuit board assembly 1 is described.

1.8.1 Preparation of Metal Supporting Board 45

Figure 6A:
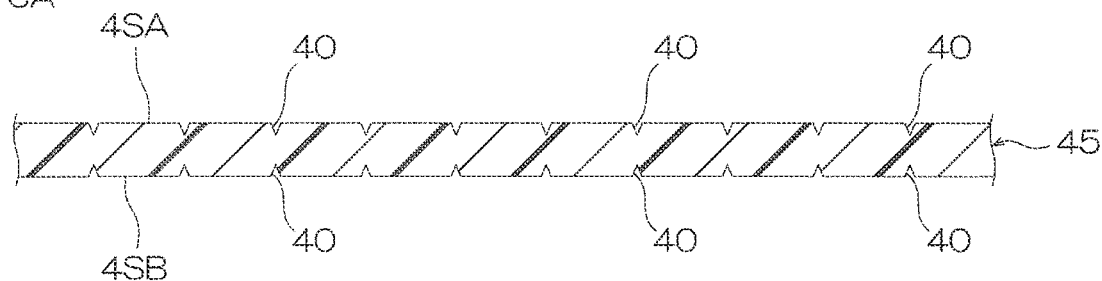
FIGS. 6A to 6D illustrate the steps of producing the wiring circuit board assembly of FIG. 2.

As illustrated in FIG. 6A, in the production method, first, the metal supporting board 45 is prepared. The metal supporting board 45 is prepared, for example, by the rolling of a metal sheet.

The metal supporting board 45 extends in the surface direction. The metal supporting board 45 has the one surface 4SA and the other surface 4SB in the thickness direction. The metal supporting board 45 is formed into the metal frame 2 and the metal supporting layer 4 by processing the outer shape of the metal supporting board 45 as described below (see FIG. 6C). The one surface 4SA and the other surface 4SB of the metal supporting board 45 have the same structures as those of the one surface 4SA and the other surface 4SB of the above-described metal supporting layer 4, respectively. In other words, each of the one surface 4SA and the other surface 4SB of the metal supporting layer 4 has a plurality of streak groove portions 40. At the moment, the metal supporting board 45 does not have the concave portions 8 yet.

1.8.2 Formation of Insulating Base Layer 5, Wiring Layer 6, and Insulating Cover Layer 7

Figure 6B:
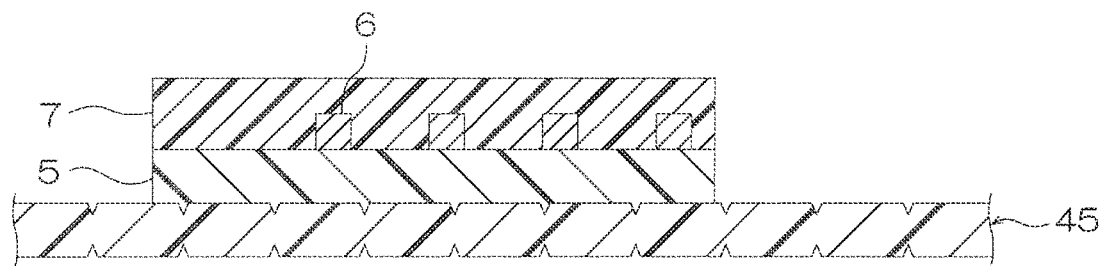

Next, as illustrated in FIG. 6B, at one side of the metal supporting board 45 in the thickness direction, the insulating base layer 5, the wiring layer 6, and the insulating cover layer 7 are formed in this order.

1.8.3 Processing of Outer Shape of Metal Supporting Board 45

Figure 6C:
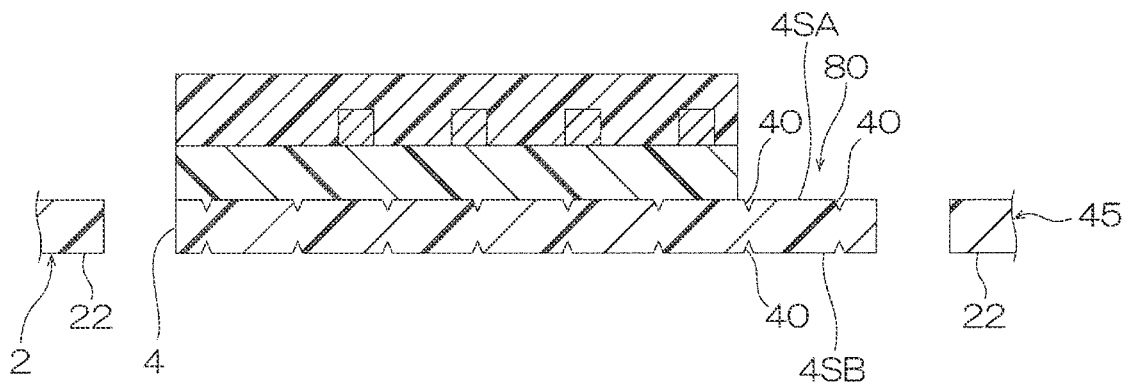

Thereafter, as illustrated in FIG. 6C, the outer shape of the metal supporting board 45 is processed, thereby forming joints 20 (see FIG. 1). In this manner, the metal frame 2 and the metal supporting layer 4 are formed. The metal frame 2 and the metal supporting layer 4 are included in a common metal supporting board 45.

1.8.4 Formation of Concave Portion 8

Figure 6D:
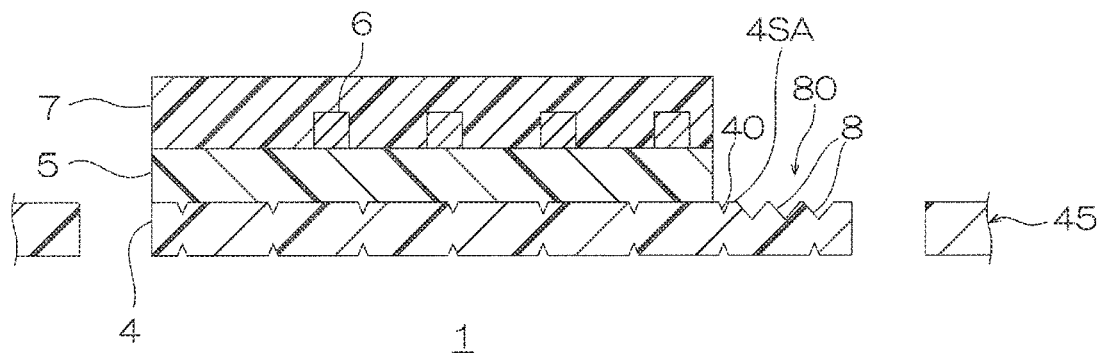

Thereafter, as illustrated in FIG. 6D, a plurality of concave portions 8 is formed in the concave portion formation region 80 on the one surface 4SA. For the formation of the concave portions 8, for example, laser irradiation is used.

Figure 7A:
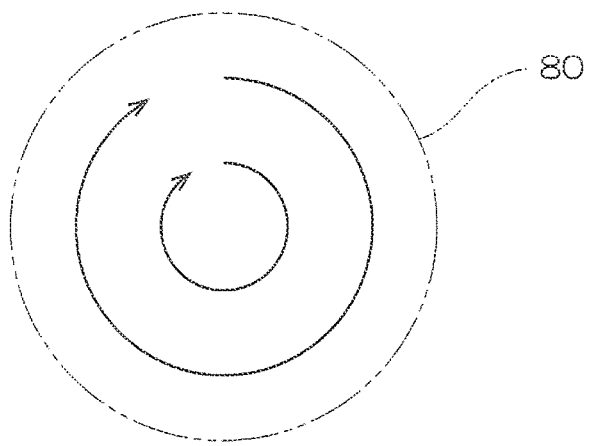
FIGS. 7A to 7C illustrate laser irradiation.
Figure 7B:
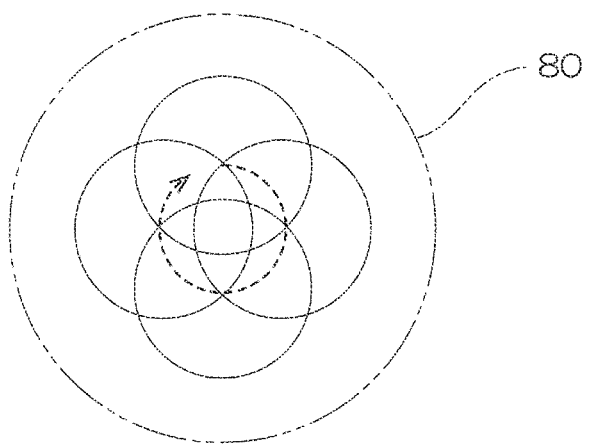
Figure 7C:
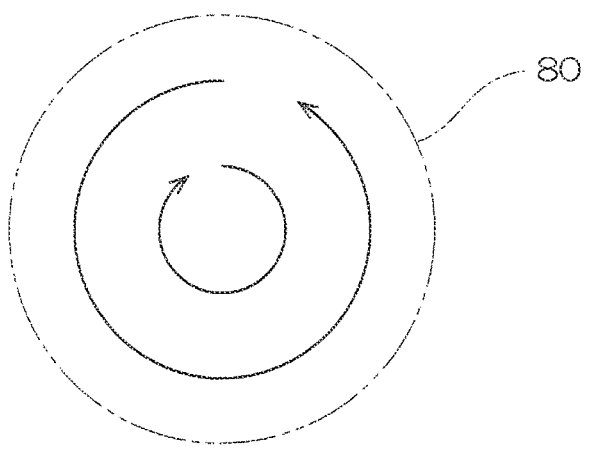

In the laser irradiation, for example, each circle of the dots 82 in the concave portion formation region 80 (see the phantom line) is irradiated with a pulsed laser several times. Specifically, as illustrated in FIGS. 7A and 7B, an inner part of a dot 82 is intermittently irradiated with a pulsed laser several times along the circumferential direction in the concave portion formation region 80. Thereafter, an outer part of the dot 82 is intermittently irradiated with a pulsed laser several times along the circumferential direction in the concave portion formation region 80. The circumferential direction in which the inner part is irradiated and the circumferential direction in which the outer part is irradiated are the same as illustrated in FIG. 7A or opposite each other as illustrated in FIG. 7C.

Figure 8A:
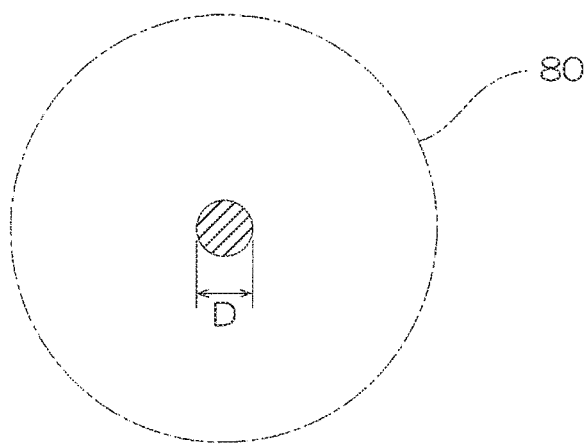
FIGS. 8A to 8C illustrate a mode in which the laser diameter of the pulsed laser is increased with each increase in the number of irradiation.
Figure 8B:
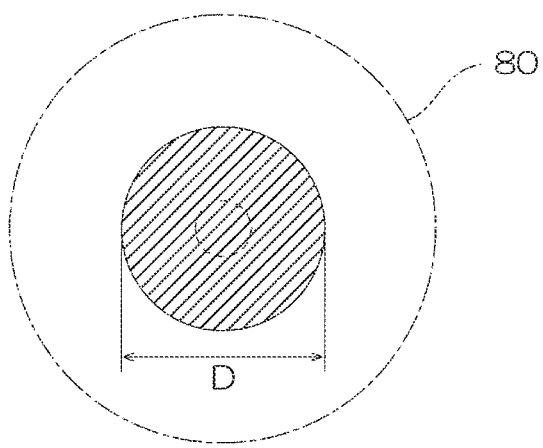
Figure 8C:
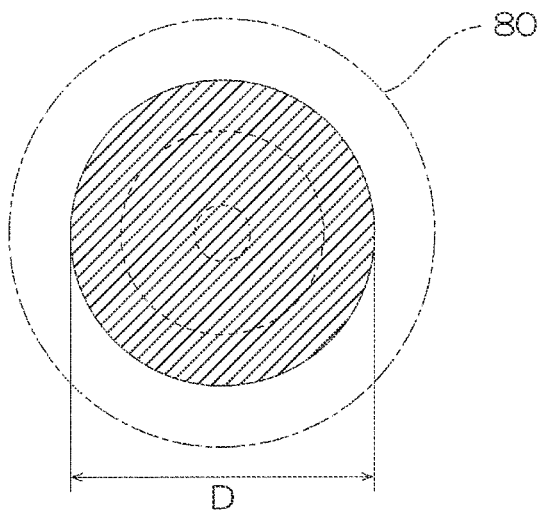

Alternatively, the laser diameter of the pulsed laser is changed corresponding to the number of irradiation. For example, as illustrated in FIGS. 8A to 8C, a laser diameter D of the pulsed laser is increased with the increase in the number of irradiation. Specifically, as illustrated in FIG. 8A, the first irradiation of the pulsed laser is carried out. Next, as illustrated in FIG. 8B, the second irradiation of the pulsed laser with a larger diameter D than that of the pulsed laser of the first irradiation is carried out. Next, as illustrated in FIG. 8C, the third irradiation of the pulsed laser with a larger diameter D than that of the pulsed laser of the second irradiation is carried out. Both the centers of the second pulsed laser and the third pulsed laser overlap the center of the first pulsed laser.

As illustrated in FIGS. 4 and 5, by the above-described laser irradiation, a concave surface 84 is formed together with a raised surface 9 on the one surface 4SA. When a concave portion 8 is formed by laser irradiation, the concave portion 8 is a laser mark.

Using chemical etching for the formation of the concave portion 8 is not suitable for the present invention. The use of chemical etching causes the formation of a concave surface 84 with a flat surface 88 along the surface direction as illustrated in FIG. 10. This easily introduces a recognition error.

1.8.5 Recognition of 2-dimensional Code C

Thereafter, with a recognition device (not illustrated), the 2-dimensional code C is recognized. The recognition device is disposed, for example, at one side of the wiring circuit board assembly 1 in the thickness direction. The recognition device includes a light source and a detection member.

First, light irradiation from the light source toward the one surface 4SA is carried out. On the flat portion 4P, a reflected light is generated. The reflected light reaches the detection member.

On the other hand, on a dot 82 (concave surface 84), although a reflected light is generated, the reflected light does not reach the detection member. In this manner, the recognition device recognizes the dot 82. The above-described recognition is repeated to recognize a plurality of dots 82. In this manner, the recognition device recognizes the 2-dimensional code C.

2. Operations and Effects of One Embodiment

In the wiring circuit board 3, each of the dots 82 of the dot pattern DP has one concave surface 84. The concave surface 84 has a conical shape. This makes the above-described concave surface 84 more recognizable than the streak groove portions 40. Thus, even if the wiring circuit board 3 includes a streak groove portion 40, the recognition error of the dot pattern DP is suppressed.

On the other hand, as illustrated in FIG. 10, when a concave surface 84 has a flat surface 88 along the surface direction, the reflected light of the flat surface 88 is recognized similarly to the reflected light of the flat portion 4P. This causes a recognition error of the dot pattern DP. In detail, there is low (or no) contrast between the reflected light generated on the flat surface 88 of the concave portion 8 and the reflected light generated on the flat portion 4P around the concave portion 8. This causes a recognition error of the concave portion 8.

When a dot 82 has a plurality of conical-shaped concave surfaces 84, each of the concave surfaces 84 becomes shallow and thus is easily confused with a streak groove portion 40. Thus, the recognition error of the dot pattern DP is not suppressed.

The wiring circuit board 3 further includes a raised surface 9 located at the outer peripheral end portion of each of the concave surfaces 84. This makes the concave portions 8 more recognizable.

When the depth D2 of the concave surface 84 is the depth D1 of the streak groove portion or more, the concave portion 8 is more recognizable.

When the diameter of each of the concave portions 8 is 50 µm or less in the wiring circuit board 3, the concave portion formation region 80 is made compact and the amount of information in the dot pattern DP is increased.

When the concave portion 8 is a laser mark, differently from a concave portion 8 formed by etching, the concave surface 84 is formed into a conical shape. Thus, the recognition error of the dot pattern DP is suppressed.

The wiring circuit board assembly 1 includes the above-described wiring circuit boards 3, and thus the recognition error of the dot pattern DP can be suppressed.

3. Variations

In each of the variations, the same members and steps as in one embodiment will be given the same reference numerals and the detailed descriptions thereof will be omitted. Further, each of the variations can have the same operations and effects as those of one embodiment unless especially described otherwise. Furthermore, one embodiment and the variations can appropriately be combined.

As illustrated with the phantom lines in FIG. 4, the dot 82 includes a second concave surface 85. The second concave surface 85 is continuous to an outer peripheral edge of the raised surface 9. The second concave surface 85 is disposed at the outermost edge of the dot 82 when being viewed from one side in the thickness direction. The second concave surface 85 is, for example, continuous in the peripheral direction of the dot 82 when being viewed from one side in the thickness direction. The second concave surface 85 has a ringed shape when being viewed from one side in the thickness direction. The second concave surface 85 is inevitably formed depending on the conditions for laser irradiation. The second concave surface 85 has a depth D3 of, for example, 1.0 µm or less, preferably 0.5 µm or less, and, for example, 0.05 µm or more, preferably 0.1 µm or more. To the depth D2 of the concave portion 8, the ratio (D3/D2) of the depth D3 of the second concave surface 85 is, for example, 0.4 or less, preferably 0.2 or less, more preferably 0.1 or less, and, for example, 0.001 or more.

In the recognition of the 2-dimensional code C, even when a dot 82 includes a concave surface 84 and a second concave surface 85, the dot 82 is recognized as a dot.

As illustrated in FIG. 9, the concave surface 84 may have a spherical cap shape. In such a case, the concave surface 84 has an approximately arc shape in a cross-sectional surface taken along the thickness direction. The spherical cap (arc) has a radius of, for example, 10 µm or more, preferably 20 µm or more, and, for example, 150 µm or less, preferably 50 µm or less.

In the present invention, the concave surface 84 only needs to have an approximately spherical cap shape or an approximately cone shape. The shape of the concave surface 84 is not strictly limited to a conical shape or a spherical cap shape. For example, although not illustrated, the concave surface 84 may have a halved spindle shape (an approximately oval shape in the cross-sectional view). The halved spindle shape is a part of a spindle that is cut in a direction orthogonal to its major axis and also a part of a solid of rotation of the oval.

Although not illustrated, the concave portion 8 is provided on both of the one surface 4SA and the other surface 4SB of the metal supporting layer 4.

As illustrated with the phantom lines in FIG. 1, the concave portion 8 can be provided on both of the metal supporting layer 4 in the wiring circuit board 3 and the outside frame 21 in the metal frame 2.

DESCRIPTION OF REFERENCE NUMERALS 1 wiring circuit board assembly
2 metal frame
3 wiring circuit board
4 metal supporting layer
4SA one surface
4SB other surface
6 wiring layer
8 concave portion
9 raised surface
40 streak groove portion
45 metal supporting board
61 wire
82 do
84 concave surface
85 second concave surface
C 2-dimensional code
DP dot pattern

The invention claimed is:

1. A wiring circuit board comprising:
    a metal supporting layer;
    an insulating layer disposed on one surface of the metal supporting layer in a thickness direction; and
    a wiring layer disposed on one surface of the insulating layer in the thickness direction, wherein
    the wiring circuit further comprises a plurality of streak groove portions disposed on the one surface and/or the other surface of the metal supporting layer in the thickness direction, and a plurality of concave portions disposed on the one surface and/or the other surface of the metal supporting layer in the thickness direction and depressed in the metal supporting layer in the thickness direction,
    the plurality of concave portions forms a dot pattern,
    each of a plurality of dots of the dot pattern has one concave surface, and
    the concave surface has an approximately spherical cap shape or an approximately cone shape.

2. The wiring circuit board according to claim 1, wherein each of the dots is located at an outer peripheral end portion of each of the concave portions and has a raised surface that is raised in the thickness direction.

3. The wiring circuit board according to claim 1, wherein a depth (D2) of the concave portion is a depth (D1) of the streak groove portion or more.

4. The wiring circuit board according to claim 1, wherein the concave portion has a diameter of 50 μm or less when the concave portion is viewed in the thickness direction.

5. The wiring circuit board according to claim 1, wherein the dot pattern is a 2-dimensional code.

6. The wiring circuit board according to claim 1, wherein the concave portions are laser marks.

7. A wiring circuit board assembly comprising:
   a metal frame; and
   a plurality of the wiring circuit boards according to claim 1 being disposed inside the metal frame, wherein
   the metal frame and the metal supporting layer are included in a common metal supporting board, and
   a plurality of streak groove portions are formed on the metal supporting board.

\* \* \* \* \*